(12) United States Patent
Li et al.

(10) Patent No.: US 12,315,469 B2
(45) Date of Patent: May 27, 2025

(54) GATE DRIVE CIRCUIT, DRIVE DEVICE AND DISPLAY DEVICE

(71) Applicant: HKC CORPORATION LIMITED, Guangdong (CN)

(72) Inventors: Jianlei Li, Guangdong (CN); Haoxuan Zheng, Guangdong (CN)

(73) Assignee: HKC CORPORATION LIMITED, Shenzheng (CN)

(*) Notice: Subject to any disclaimer, the term of this patent is extended or adjusted under 35 U.S.C. 154(b) by 0 days.

(21) Appl. No.: 17/800,341

(22) PCT Filed: Dec. 23, 2021

(86) PCT No.: PCT/CN2021/140936
§ 371 (c)(1),
(2) Date: Aug. 17, 2022

(87) PCT Pub. No.: WO2022/199167
PCT Pub. Date: Sep. 29, 2022

(65) Prior Publication Data
US 2024/0296808 A1    Sep. 5, 2024

(30) Foreign Application Priority Data

Mar. 25, 2021    (CN) .......................... 202110317868.4

(51) Int. Cl.
*G09G 3/36*    (2006.01)
*G11C 19/28*    (2006.01)

(52) U.S. Cl.
CPC ......... *G09G 3/3677* (2013.01); *G11C 19/287* (2013.01); *G09G 3/3614* (2013.01);
(Continued)

(58) Field of Classification Search
CPC ............... G09G 3/3677; G09G 3/3614; G09G 2310/0286; G09G 2310/0291; G09G 2340/0435; G11C 19/287
See application file for complete search history.

(56) References Cited

U.S. PATENT DOCUMENTS 11,037,501 B2 * 6/2021 Li .......................... G09G 3/3266
2015/0279480 A1 * 10/2015 Murakami ........... G09G 3/3677
345/100

(Continued)

FOREIGN PATENT DOCUMENTS

CN    101483068 A    7/2009
CN    102881248 A    1/2013
(Continued)

OTHER PUBLICATIONS

International Search Report issued on Aug. 3, 2022 in corresponding International application No. PCT/ CN2021/140936; 4 pages.

*Primary Examiner* — Patrick N Edouard
*Assistant Examiner* — Eboni N Giles
(74) *Attorney, Agent, or Firm* — Maier & Maier, PLLC (57) ABSTRACT

The present application provides a gate drive circuit, a drive device and a display device. The gate drive circuit includes m switch groups, n first shift registers and m second shift registers. Each switch group includes n first switch units. The n first shift registers cyclically output a first row-scan signal, while each second shift register controls the n first switch units connected to each first controlled node corresponding to the second shift register to be turned on, so that the first row-scan signal is fed back to each gate-line in turn, to realize a line-by-line scan driver. The gate drive circuit only needs n+m shift registers to complete the gate drive, compared with the existing gate drive circuit requiring n×m (Continued)

shift registers, the number of shift registers is reduced, the cost is reduced and the manufacturing process is simplified.

15 Claims, 7 Drawing Sheets

(52) U.S. Cl.
CPC .............. *G09G 2310/0286* (2013.01); *G09G 2310/0291* (2013.01); *G09G 2340/0435* (2013.01)

(56) References Cited

U.S. PATENT DOCUMENTS

| | | | | |
|---|---|---|---|---|
| 2016/0078834 | A1* | 3/2016 | Hong | G11C 19/00 345/212 |
| 2019/0164504 | A1* | 5/2019 | Hayashi | G09G 3/344 |
| 2020/0074951 | A1* | 3/2020 | Lu | G02F 1/13306 |

FOREIGN PATENT DOCUMENTS

| | | |
|---|---|---|
| CN | 103000121 A | 3/2013 |
| CN | 107123391 A | 9/2017 |
| CN | 109410810 A | 3/2019 |
| IN | 107016971 A | 8/2017 |
| KR | 20200001285 A | 1/2020 |
| WO | 2008100370 A | 8/2008 |

* cited by examiner

GATE DRIVE CIRCUIT, DRIVE DEVICE AND DISPLAY DEVICE

CROSS-REFERENCE TO THE RELATED APPLICATIONS

This application is the national phase entry of International Application No. PCT/CN2021/140936, filed on Dec. 23, 2021, which is based up and claims priority to the Chinese Patent Application No. 202110317868.4, filed Mar. 25, 2021, the entire contents of which are incorporated herein by reference.

FIELD

The present application relates to the field of gate drive technology, and more particularly, to a gate drive circuit, a drive device and a display device.

BACKGROUND

At present, a conventional gate drive circuit is provided with N shift registers arranged in sequence, the N shift registers are respectively connected to N scan lines of the display panel, and row-scan signals are then output to turn on the pixel units of each row successively.

However, a shift register is required for the gate drive circuit to drive each row of pixel units, resulting in high cost and complicated manufacturing process.

SUMMARY

An object of the present application is to provide a gate drive circuit, aiming to solve the problems of high cost and complicated manufacturing process existed in the conventional gate drive circuits.

In order to solve the above problems, embodiments of the present application may be implemented as follows:

In accordance with a first aspect of the embodiments of the present application, a gate drive circuit is provided. The gate drive circuit is applied to a display panel, and includes m switch groups, n first shift registers and m second shift registers.

Each switch group includes n first switch units, an output end of each first switch unit is configured in connection with a gate-line of the display panel, and controlled ends of the n first switch units of each switch group are connected in common to form a first controlled node, and input ends of i-th first switch units in each of the m switch groups are connected in common to form an i-th input node, where m and n are positive integers, i=1, 2, . . . , n.

The n first shift registers are connected in sequence and are respectively connected to the n input nodes in a one-to-one correspondence, the n first shift registers are configured, according to a first start signal and a first clock pulse signal, to output a first row-scan signal to each of the input nodes in turn and loop.

The m second shift registers are connected in sequence and are respectively connected to the m controlled nodes in a one-to-one correspondence, the m second shift registers are configured, according to a second start signal and a second clock pulse signal, to output a second row-scan signal to each of the first controlled nodes in turn, so as to sequentially trigger on the n first switch units connected to each of the first controlled nodes, so that the first row-scan signal is fed back to each of the gate-lines in turn.

Optionally, the first switch unit is an electronic switch tube.

Optionally, a duty ratio of the first clock pulse signal and the second clock pulse signal is n:1, and n is greater than 1.

Optionally, the gate drive circuit also includes n/2 second switch units, the first shift registers are divided into groups, each group has two first shift registers, each of the second switch units is connected in parallel between the output ends of the two first shift registers in each group, controlled ends of each of the second switch units are connected in parallel to form a second controlled node, and each of the second switch units is configured to be turned on or off simultaneously while receiving a control signal.

Optionally, the gate drive circuit also includes a precharge circuit, and the precharge circuit includes m−1 first unidirectional conduction units and m−1 second unidirectional conduction units.

The m−1 first unidirectional conduction units are respectively connected one by one between adjacent signal output ends of the m second shift registers, and each of the second unidirectional conduction units is respectively connected to the output ends of the shift registers range from the 2-nd one to the m-th one in a unidirectional manner. A positive input end of each first unidirectional conduction unit is connected to the output end of the previous second shift register or a positive output end of one second unidirectional conduction unit. A negative output end of each first unidirectional conduction unit is connected to a negative output end of another second unidirectional conduction unit.

Each of the first unidirectional conduction units is configured to synchronously output the second row-scan signal output from the previous second shift register to the controlled node where a next second shift register is connected, when the second row-scan signal is output from the previous second shift register, thereby enabling two thin film transistors in n adjacent rows in the display panel to be turned on to perform charging and precharging of data signals.

Optionally, the second unidirectional conduction unit is configured to isolate and prevent the second row-scan signal from feeding back to the second shift registers.

Optionally, both the first unidirectional conduction unit and the second unidirectional conduction unit are diodes.

Optionally, the precharge circuit further includes m−1 third switch units, each of the third switch units is connected to a front stage of each of the first unidirectional conduction units, and controlled ends of each of the third switch units are connected in common to form a third controlled node.

Each of the third switch units is configured to be turned on or off simultaneously while receiving a control signal.

Optionally, both the first shift register and the second shift register are bidirectional shift registers.

Optionally, the gate drive circuit also includes first signal input ends for receiving input of a first row-scan-direction control signal, the first signal input ends are respectively connected to signal ends of the n first shift registers.

The n first shift registers are also configured to sequentially output the first row-scan signals in a first direction or sequentially output the first row-scan signals in a second direction according to the first row-scan-direction control signal, and the first direction and the second direction are opposite.

Optionally, the gate drive circuit also includes second signal input ends for receiving input of a second row-scan-direction control signal, the second signal input ends are respectively connected to signal ends of the m second shift registers.

The m second shift registers are also configured to sequentially output the second row-scan signal in a third direction or sequentially output the second row-scan signal in a fourth direction according to the second row-scan-direction control signal, and the third direction and the fourth direction are opposite.

Optionally, the gate drive circuit further includes N AND gates and third signal input ends for receiving input of an enable signal, the third signal input ends are respectively connected to the first signal input ends of each of the AND gates. A second signal input end of each AND gate is connected to the output end of one of the first switch units, where, N=m×n.

Each of the AND gates is configured to output the first row-scan signal when the enable signal is at a high level, and cut off the first row-scan signal when the enable signal is at a low level.

Optionally, the gate drive circuit further includes N level converters, each of the level converters is connected to one of the AND gates.

The level converter is used configured to convert the first row-scan signal output from the AND gate into a row-output high-level signal or a row-output low-level signal.

Optionally, the gate drive circuit further includes N output buffers, and the N output buffers are respectively connected to the N level converters in a one-to-one correspondence.

The output buffer is configured to power amplify a level signal output from the level converter.

In accordance with a second aspect of the embodiments of the present application, a drive device is provided. The drive device includes a timing controller, a source drive circuit, and the gate drive circuit as described above; The timing controller is respectively connected to the source drive circuit and the gate drive circuit, the source drive circuit is connected to a plurality of data lines of the display panel, and the gate drive circuit is connected to a plurality of gate-lines of the display panel.

In accordance with a third aspect of the embodiments of the present application, a display device is provided, which includes a display panel and the drive device as above-mentioned.

In the above-mentioned gate drive circuit, the first row-scan signal is output cyclically through n first shift registers, while each second shift register is configured to control the n first switch units connected to each corresponding first controlled node to be turned on, so that the first row-scan signal is fed back to each gate-line in turn to realize a line-by-line scan driver. The gate drive circuit only needs n+m shift registers to complete the gate drive. Compared with the existing gate drive circuit, which requires n×m shift registers, the number of shift registers is reduced, thereby reducing costs and simplifying the manufacturing process.

It should be understood that, for beneficial effects in the second aspect and the third aspect, reference may be made to the relevant descriptions in the first aspect, which will not be repeated here.

BRIEF DESCRIPTION OF THE DRAWINGS

In order to illustrate solutions in the embodiments of the present application more clearly, the following will briefly introduce the drawings that need to be used in description of the embodiments or the existing technologies. Obviously, the drawings in the following description are only some embodiments of the present application. For those of ordinary skill in the art, other drawings can also be obtained according to these drawings without any creative effort.

DETAILED DESCRIPTION OF THE EMBODIMENTS

In order to make the problems to be solved, solutions and beneficial effects of the present application more comprehensible, the present application will be described in further detail below with reference to the drawings and embodiments. It should be understood that specific embodiments described herein are intended only to interpret the present application, and are not intended to limit the present application.

In addition, the terms "first" and "second" are only used for descriptive purposes, and should not be construed as indicating or implying relative importance or implying the number of indicated technical features. Thus, a feature defined with "first" or "second" may expressly or implicitly include one or more of that feature. In the description of the present application, the phase "a/the plurality of" means two or more, unless expressly and specifically defined otherwise.

In accordance with a first aspect, an embodiment of the present application provides a gate drive circuit 100, which may be applied to a display panel 1.

Figure 1:
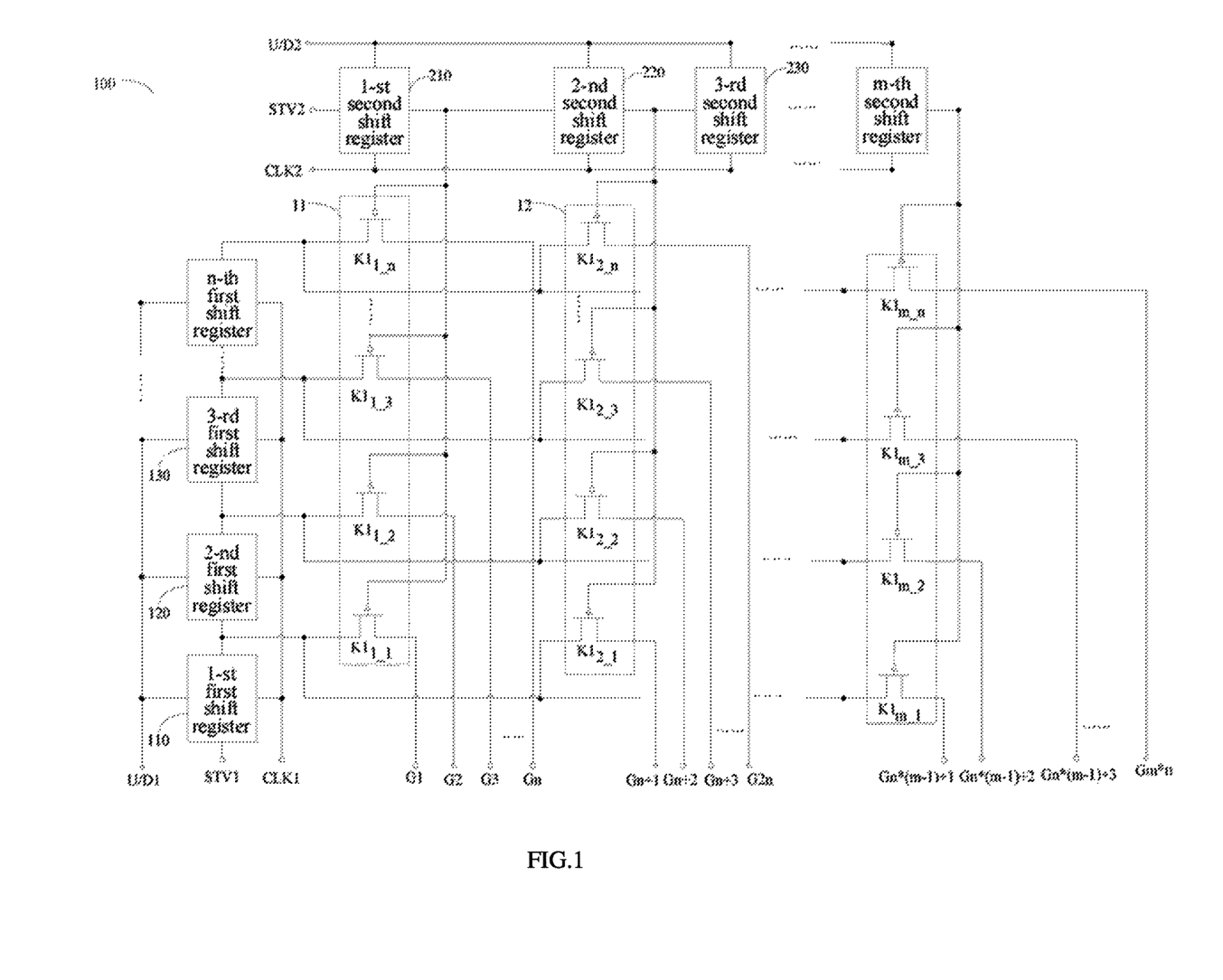
FIG. 1 is a schematic diagram of a first structural of a gate drive circuit in accordance with an embodiment of the present application.

As shown in FIG. 1, FIG. 1 is a first structural schematic diagram of a gate drive circuit 100 provided by an embodiment of the present application. In this embodiment, the gate drive circuit 100 includes m switch groups, n first shift registers and m second shift registers.

The m switch groups include a 1-st switch group 11, . . . , and a m-th switch group, each switch group includes n first switch units. An output end of each first switch unit is configured in connection with a corresponding gate-line of the display panel 1. Controlled ends of the n first switch units of one switch group are connected in common to form a first controlled node. Input ends of i-th first switch units in each of the m switch groups are connected in common to form an i-th input node, where m and n are positive integers, i=1, 2, . . . , n.

The n first shift registers are connected in sequence and are respectively connected to the n input nodes in a one-to-one correspondence, and the n first shift registers are configured, according to a first start signal STV1 and a first clock pulse signal CLK1, to output a first row-scan signal to each input node in turn and then loop;

The m second shift registers are connected in sequence and are respectively connected to m controlled nodes in a one-to-one correspondence, and the m second shift registers are configured, according to a second start signal STV2 and a second clock pulse signal CLK2, to output a second row-scan signal to each of the first controlled nodes in turn, so as to sequentially trigger on the n first switch units connected to the respective first controlled node, so that the first row-scan signal is fed back to each gate-line in turn.

In this embodiment, the n first shift registers include a 1-st first shift register 110, . . . , and a n-th first shift register, and the m second shift registers include a 1-st second shift register 210, . . . , and a m-th second shift register. The input ends of the i-th first switch units in each of the m switch group are connected in common to form the i-th input node. That is, the 1-st first switch unit $K1_{1\_1}$ of the first switch group 11, the 1-st first switch unit $K1_{2\_1}$ of the second switch group 12, . . . , and the 1-st first switch unit $K1_{m\_1}$ of the m-th switch group, are connected in common to form a first input node. The 2-nd first switch unit $K1_{1\_2}$ of the first switch group 11, the 2-nd first switch unit $K1_{2\_2}$ of the second switch group 12, . . . , and the 2-nd first switch unit $K1_{m\_2}$ of the m-th switch group, are connected in common to form a second input node, and so on. Each switch group includes n first switch units, thus forming n input nodes, the n input nodes are arranged in sequence, and are respectively connected to the output ends of the n first shift registers in sequence. That is, the first input node is connected to the output end of the 1-st first shift register 110, the second input node is connected to the output end of the 2-nd first shift register 120, . . . , and the n-th input node is connected to the n-th first shift register.

Meanwhile, the controlled ends of the first switch units in one switch group are connected in common, and the m switch groups form m first controlled nodes. The m first controlled nodes are respectively connected to the output ends of the m second shift registers in sequence. That is, a 1-st first controlled node formed by the controlled ends of the first switch units $K1_{1\_1}$ to $K1_{1\_n}$ of the 1-st switch group 11 is connected to the output end of the 1-st second shift register 210, a 2-nd first controlled node formed by the controlled ends of the first switch units $K1_{2\_1}$ to $K1_{2\_n}$ of the second switch group is connected to the output end of a 2-nd second shift register 220, . . . , and a m-th first controlled node formed by the controlled ends of the first switch units of the m-th switch group is connected to the output end of the m-th second shift register.

The switch group can be understood as forming a switch array equivalent to m rows and n columns. The second shift register is configured to output a second row-scan signal row by row to control the n first switch units of each row to be turned on and off simultaneously. Meanwhile, the first shift register is configured to output the first row-scan signal to each input node column by column, and output cyclically, so that the first row-scan signal is sequentially output to each gate-line of the display panel 1 to realize a line-by-line scanning.

In an example, a direction from the 1-st second shift register 210 to the m-th second shift register is defined as a scanning direction. The 1-st second shift register 210 is configured to output the second row-scan signal to the 1-st first switch unit $K1_{1\_1}$, . . . , and the n-th first switch unit $K1_{1\_n}$ of the first switch group 11 upon receiving the second clock signal CLK2 and the second start signal STV2, and the n first switch units are simultaneously triggered on, meanwhile, the second row-scan signal is used as a start signal of the 2-nd second shift register 220, so that the row-by-row output of the second row-scan signal is enabled. The 1-st first shift register 110, . . . , and the n-th first shift register sequentially output the first row-scan signal according to the received first start signal STV1 and the first clock pulse signal CLK1, before the second row-scan signal is output from the 2-nd second shift register 220, thereby sequentially outputting n first row-scan signals to the first gate-line to the nth gate-line of the display panel 1. The m second shift registers sequentially output the second row-scan signal to turn on the m switch groups in sequence, and the n first shift registers as a whole is cyclically output in output intervals between two second row-scan signals, thereby outputting N first row-scan signals to the N gate-lines of the display panel 1 to control the display panel 1 to be turned on line by line.

Instead of arranging N shift registers to output the row-scan signals line by line, where N=m×n, and n is greater than 1, the gate drive circuit 100, by arranging n first shift registers, m second shift registers and m switch groups, only needs m+n shift registers to realize a line-by-line output of the row-scan signal, thus the number of shift registers is reduced, thereby achieving the purpose of reducing design cost and simplifying manufacturing process.

The number n can be designed according to the design cost, wiring requirements and the type of the display panel 1. In an example, the display panel 1 may include 1080 gate-lines arranged in sequence, the number n may be 4, 6, 8, 10, etc. At 10, the wiring is complicated. Considering the cost and wiring requirements, 4 may be the best choice, that is, the gate drive circuit 100 may need 4+1080/4=274 shift registers. The number n may be selected according to different types of display panels 1, the design cost and wiring requirements, which will not be limited here.

Each first switch unit may be a switch circuit with controlled on-and-off. In an embodiment, the first switch unit is an electronic switch tube, which may be a triode or a MOS tube, in order to achieve an efficient driving. In an embodiment, the first switch unit is a MOS tube.

Figure 2:
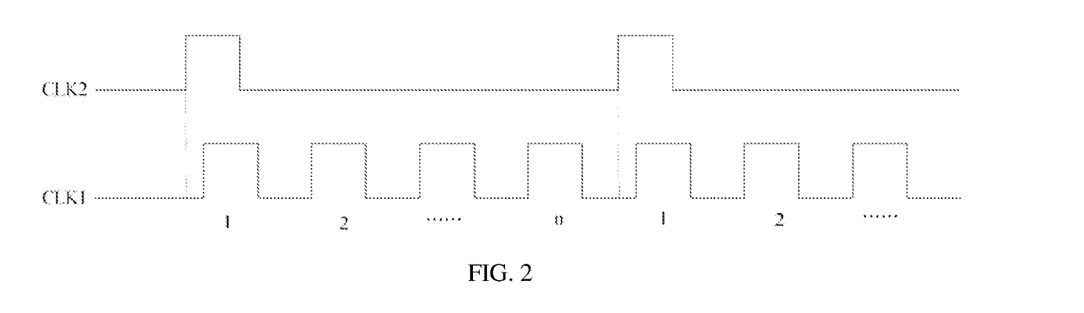
FIG. 2 is a schematic waveform diagram of a clock pulse signal in the gate drive circuit shown in FIG. 1.

In one embodiment, in order to realize that the n first shift registers as a whole are cyclically output in output intervals between two second row-scan signals, as shown in FIG. 2, a duty ratio of the first clock pulse signal CLK1 and the second clock pulse signal CLK2 is n:1, and n is greater than 1.

For example, the 1-st second shift register 210 is configured to output the second row-scan signal to each first switch unit of the first switch group when a rising edge of the first clock pulse signal is arrived, and meanwhile, the first row-scan signal has n rising edges between the two second row-scan signals. That is, the 1-st first shift register 110 to the n-th first shift register sequentially output n first row-scan signals, between the two second row-scan signals, to the 1-st first switch unit $K1_{1\_1}$, . . . , and the n-th first switch unit $K1_{1\_n}$ of the first switch group, and are sequentially output to the first gate-line, . . . , and the n-th gate-line of the display panel 1 through the first switch units, by such analogy, n first row-scan signals are cycled in turn after each second row-scan signal is output, and finally N first row-scan signals are output to the N gate-lines of the display panel 1 to achieve the row-by-row turn-on, where N=m×n.

In this embodiment, the number n can be selected according to different types of display panels 1, design costs and wiring requirements, which will not be limited here.

Figure 3:
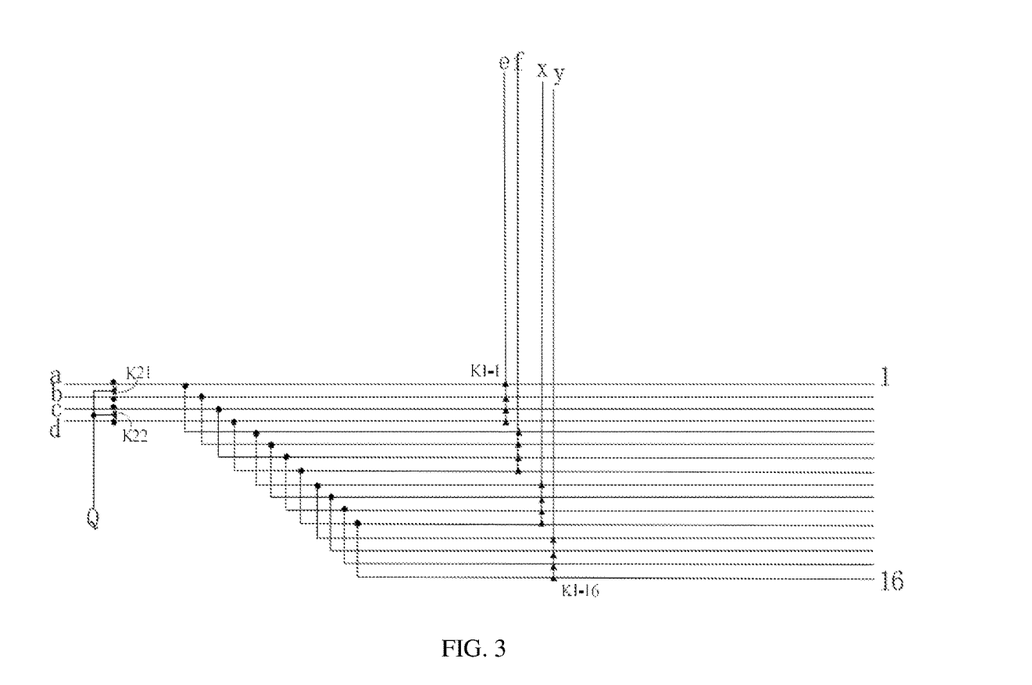
FIG. 3 is a schematic diagram of a second structure of the gate drive circuit in accordance with an embodiment of the present application.

In this embodiment, the display panel 1 includes M columns×N rows of pixel units, where M is the number of columns of pixel units in the display panel 1, and N is the number of rows of pixel units in the display panel 1 and is also the number of gate-lines. In order to achieve different resolutions and operating modes, as shown in FIG. 3, in an embodiment, the gate drive circuit also includes n/2 second switch units (for example, second switch units K21 and K22, etc.). The first shift registers are divided into groups, each group has two first shift registers, each second switch unit is connected in parallel between the output ends of the two first shift registers in each group, and the controlled ends of each second switch unit are connected in parallel to form a second controlled node Q, each of the second switch units is configured to be turned on or off simultaneously while receiving a control signal.

Under normal circumstances, a refresh frequency of a screen of the display panel 1 is 60 Hz. For example, the UD screen is 4K×2K LCD screen having 3840×2160 pixels, and the refresh frequency is generally 60 Hz. In order to enable the small size UD screen (such as 32 inches) to support 4K×1K, and also support a refresh frequency of 120 Hz, that is, the number of rows in one frame is changed from 2160 to 1080, and the time of one frame is changed from 1/60 seconds to 1/120 seconds, two adjacent rows of pixel units are required to be combined into one row of pixel units, that is, 3840×1080 pixels. In this embodiment, the output ends of the two first shift registers are connected through the second switch unit. When the scanning signal in the first row is output to the gate-line of the display panel 1, the two rows of thin-film transistors connected can be turned on at the same time, thereby realizing the charging of the two rows of pixel units, and also, the refresh frequencies of the first clock pulse signal and the second clock pulse signal are doubled, so that the display panel 1 can work in 4K×1K, 120 Hz working mode, thereby increasing the working mode of the display panel 1, and realizing the display diversity of the display panel 1.

Figure 4:
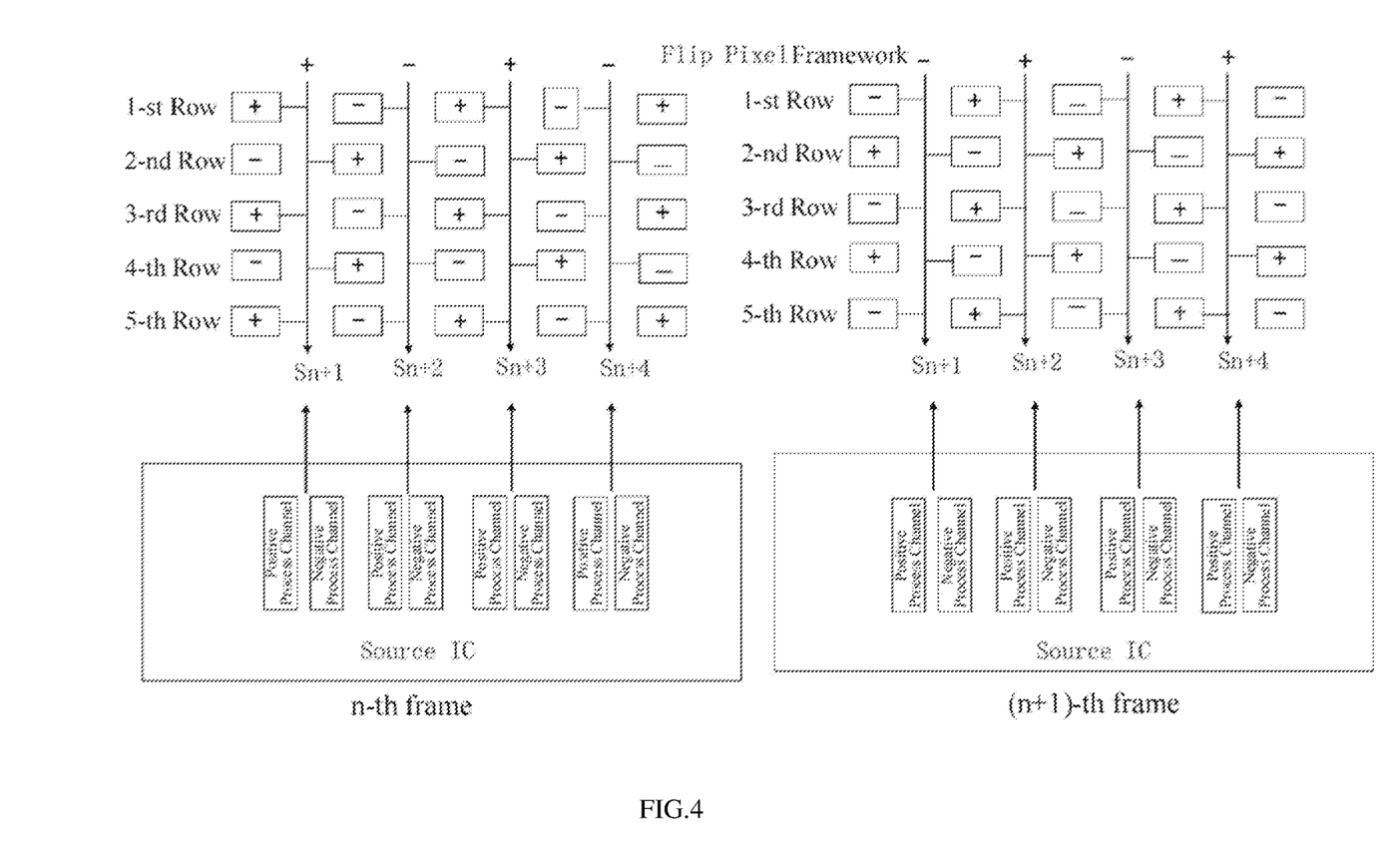
FIG. 4 is a schematic diagram showing a first polarity change of pixel units in a display panel.

As shown in FIG. 4, FIG. 4 is a schematic diagram showing a first polarity change of pixel units in the display panel 1. In the same frame, the voltage polarity of the data signal on the data line of the display panel 1 remains unchanged, while the polarity is switched between positive and negative in adjacent frames. Therefore, when the data signal of the display panel 1 changes as shown in FIG. 4, the gate drive circuit may have no change.

Figure 5:
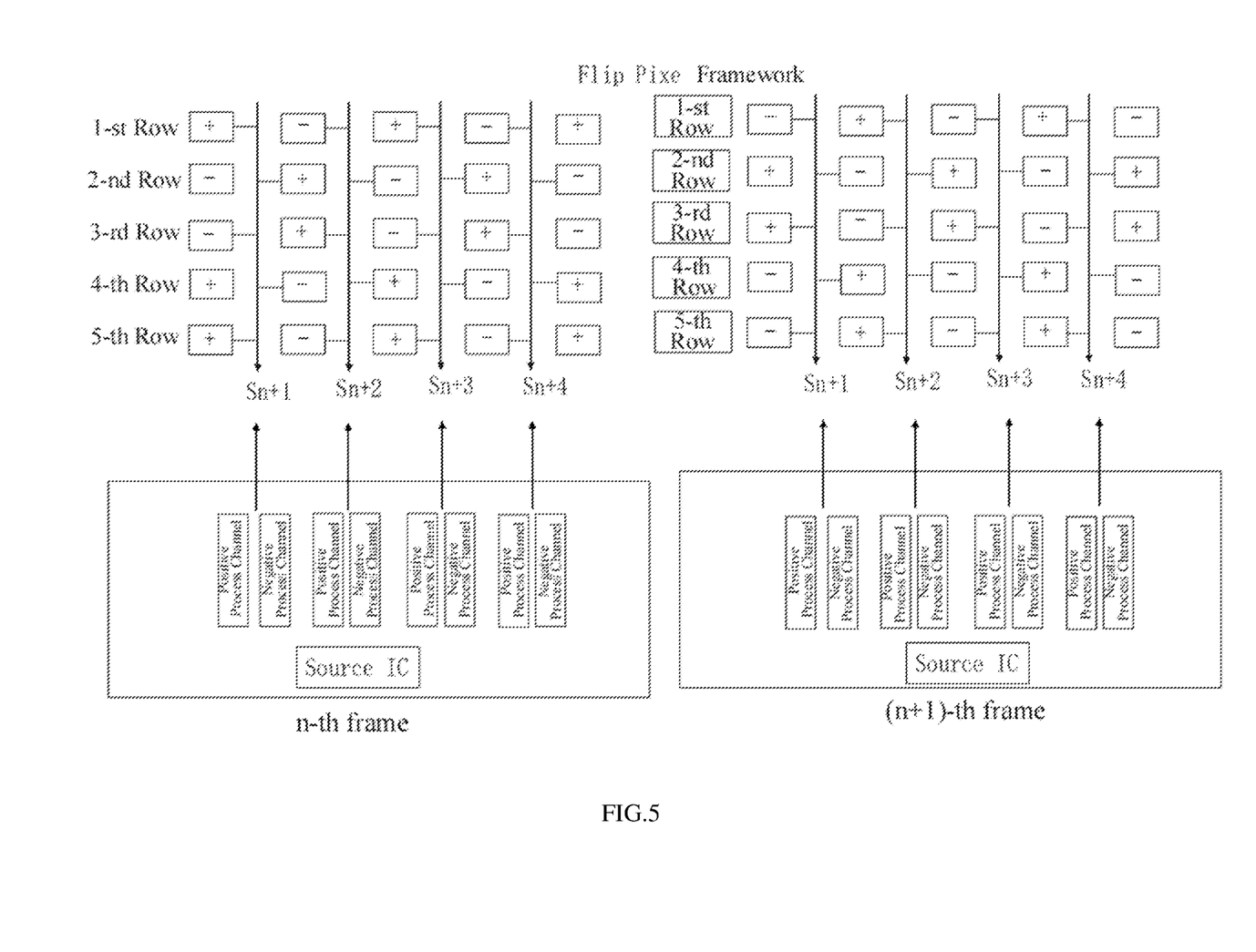
FIG. 5 is a schematic diagram showing a second polarity change of pixel units in the display panel.
Figure 6:
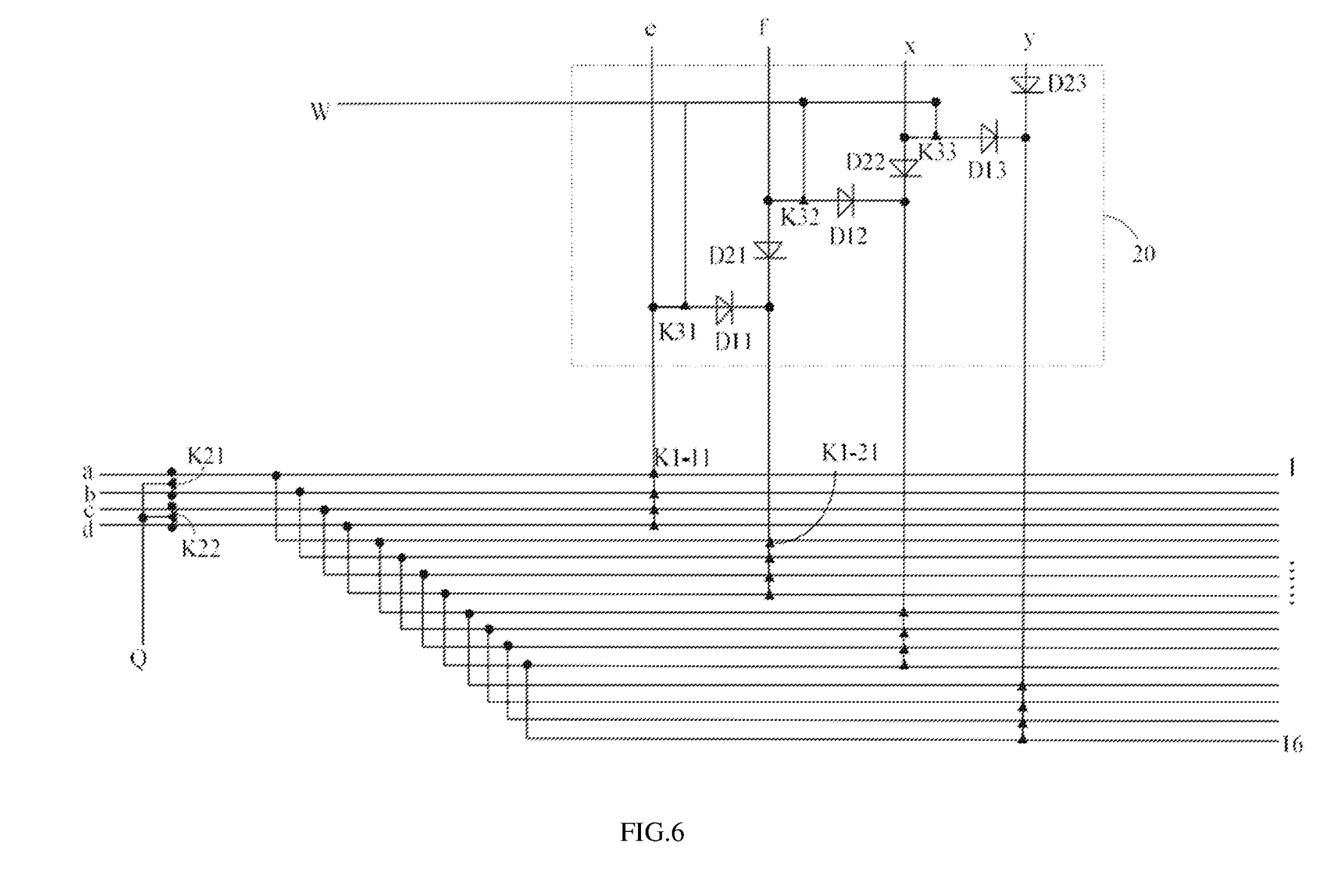
FIG. 6 is a schematic diagram of a third structure of the gate drive circuit in accordance with an embodiment of the present application.

As shown in FIG. 5, FIG. 5 is a schematic diagram showing a second polarity change of pixel units in the display panel 1. In the same frame picture, the polarity of the voltage on the data line of the display panel 1 is reversed when the adjacent row is turned on. At this time, a corresponding precharge circuit may be added to reduce the time required for formal charging. As shown in FIG. 6, in one embodiment, the gate drive circuit further includes a precharge circuit. The precharge circuit includes m−1 first unidirectional conduction unit (D11, D12, D13, etc.) and m−1 second unidirectional conduction unit (D21, D22, D23, etc.).

The m−1 first unidirectional conduction units are respectively connected one by one between adjacent signal output ends of the m second shift registers, and each of the second unidirectional conduction units is respectively connected to the output ends of the shift registers ranges from the 2-nd one to the m-th one in a unidirectional manner.

A positive input end of each first unidirectional conduction unit is connected to the output end of the previous second shift register or a positive output end of one second unidirectional conduction unit. A negative output end of each first unidirectional conduction unit is connected to a negative output end of another second unidirectional conduction unit.

Each first unidirectional conduction unit is configured to synchronously output the second row-scan signal output from a previous second shift register to the controlled node where a next second shift register is connected, when the second row-scan signal is output from the previous second shift register, thereby enabling two thin film transistors in n adjacent rows in the display panel 1 to be turned on to perform charging and precharging of data signals.

For example, when the second row-scan signal is output from an output end e of the 1-st second shift register 210 to the 1-st first switch unit K1-11, the second row-scan signal is also input, via a first unidirectional conduction unit D11, to the 1-st first switch unit K1-21 in the adjacent switch group. At this time, the two switch units are turned on simultaneously. The first row-scan signal output from the output port a of the 1-st first shift register 110 is also input to a first row gate-line and a fifth row scan-line of the display panel 1 through the two switch units, so that the scan signal of the fifth row is turned on in advance, and the pixel voltage controlled by this row is turned over to a target voltage of the current frame in advance, thereby offsetting a gate signal delay caused by the scan-line load, and also increasing the charging rate of pixel.

By such analogy, the second row-scan signal output from the previous second shift register is output by the first unidirectional conduction unit to the next controlled node in advance, so that the first switch unit connected to this controlled node and the input node that has received the first row-scan signal is turned on in advance, and the second row-scan signal is output to the gate-lines separated by n rows in advance, and the two thin film transistors in n adjacent rows in the display panel 1 are turned on to perform charging and precharging of data signals.

The second unidirectional conduction unit is used for signal isolation, to prevent the second row-scan signal from feeding back to the second shift registers and non-adjacent controlled nodes.

The first unidirectional conduction unit and the second unidirectional conduction unit may be optocouplers, diodes or other unidirectional output structures. In one embodiment, the first unidirectional conduction unit and the second unidirectional conduction unit are both diodes.

Still referring to FIG. 6, in one embodiment, in order to improve the diversity and compatibility of the display panel 1, the precharge circuit may also include m−1 third switch units (K31, K32, K33, etc.), each third switch unit (K31, K32, K33, etc.) is connected to a front stage of each first unidirectional conduction unit, and controlled ends of each third switch unit are connected in common to form a third controlled node.

Each of the third switch units is configured to be turned on or off simultaneously while receiving a control signal.

In this embodiment, each third switch unit can be controlled to be turned on or off simultaneously by outputting different control signals, so that the display panel 1 can satisfy the polarity change of pixel units as shown in FIG. 4 and FIG. 5. When the third switch units are turned off, the gate drive circuit can be applied to the display panel 1 shown in FIG. 4, and when all switch units are turned on, the gate drive circuit can be applied to the display panel that needs to be precharged as shown in FIG. 5. 1. According to the display requirements, the switch state of the third switch unit can be correspondingly switched, so as to improve the gate drive circuit and the display diversity and compatibility of the corresponding display panel 1.

To realize the driving manner of bidirectional scan, in one embodiment, the first shift register and the second shift register are both bidirectional shift registers, that is, m second shift registers may be turned on in sequence from the 1-st second shift register 210 to the m-th second shift register, or from the m-th second shift register to the 1-st second shift register 210, according to the received row-scan-direction control signal, so as to trigger on each switch group correspondingly. Meanwhile, the first shift register may be turned on in sequence from the 1-st first shift register 110 to the n-th first shift register, or from the n-th first shift register to the 1-st first shift register 110, according to the received row-scan-direction control signal, and then loop. Thus, as shown in FIG. 1, in one embodiment, the gate drive circuit 100 also includes first signal input ends for receiving input of a first row-scan-direction control signal U/D1, the first signal input ends are respectively connected to the signal ends of the n first shift registers.

The n first shift registers are also configured to sequentially output the first row-scan signal in a first direction or sequentially output the first row-scan signal in a second direction according to the first row-scan-direction control signal U/D1. The first direction is opposite to the second direction, where the first direction may be defined as from the 1-st first shift register 110 to the n-th first shift register, while the second direction is from the n-th first shift register to the 1-st first shift register 110.

The gate drive circuit 100 also includes second signal input ends for receiving input of a second row-scan-direction control signal U/D2, and the second signal input ends are respectively connected to the signal ends of the m second shift registers;

The m second shift registers are also configured to sequentially output the second row-scan signal in a third direction or sequentially output the second row-scan signal in a fourth direction according to the second row-scan-direction control signal U/D2. The third direction is opposite to the fourth direction is reversed, where the third direction may be defined as from the 1-st second shift register 210 to the m-th second shift register, and the fourth direction is from the m-th second shift register to the 1-st second shift registers 210.

Figure 7:
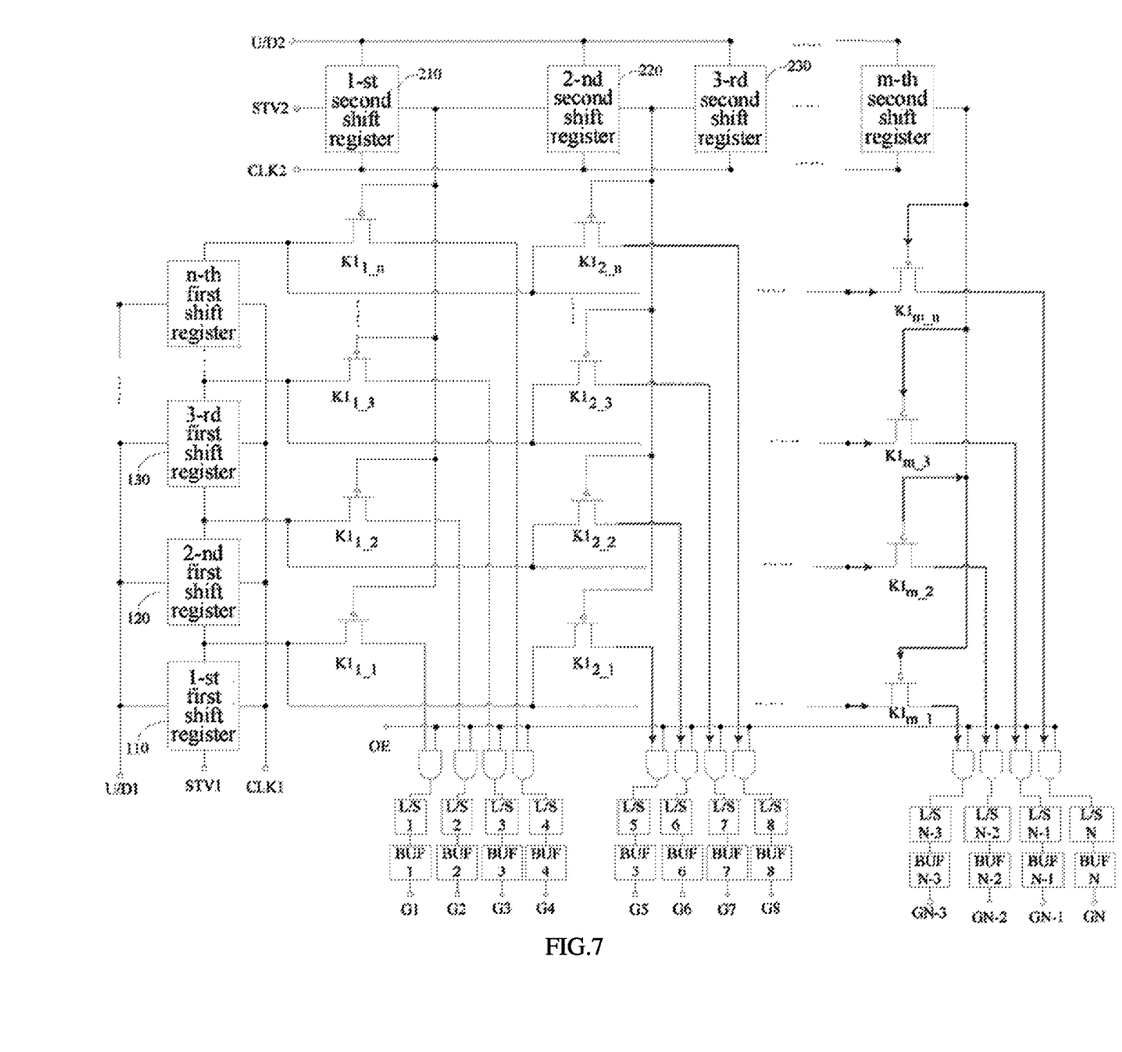
FIG. 7 is a schematic diagram of a fourth structure of the gate drive circuit in accordance with an embodiment of the present application.

As shown in FIG. 7, in order to realize the enable output, in one embodiment, the gate drive circuit 100 may also include N AND gates (U1 to UN) and a third signal input end for receiving input of an enable signal OE. The third signal input ends are respectively connected to first signal input ends of each AND gate, and a second signal input end of each AND gate is connected to the output end of a first switch unit, where, N=m×n;

Each AND gate is configured to output the first row-scan signal when the enable signal OE is at a high level, and cut off the first row-scan signal when the enable signal OE is at a low level. That is, the output of the first row-scan signal is allowed when the enable signal OE is at a high level.

Still referring to FIG. 7, in one embodiment, the gate drive circuit 100 may also include N level converters (including L/S1 to L/S N), N output buffers (including BUF1 to BUF N), a fourth signal input end for receiving input of a row-output high-level signal Vgh and a fifth signal input end for receiving input of a row-output low-level signal Vgl. Each level converter is respectively connected to the fourth signal input end and the fifth signal input end, and each level converter is also connected to an AND gate. The N output buffers are respectively connected to the N level converters in a one-to-one correspondence.

The level converter is configured to convert the first row-scan signal output from the AND gate into the row-output high-level signal or the row-output low-level signal; The output buffer is configured to power amplify the level signal output from the level converter.

In this embodiment, the level converters are connected in sequence, and the low level of 0V and 3.3V in the scanning signal of the first row are respectively converted into a low-level signal Vgl of about −8V and a high-level signal Vgh of about 30V, so as to realize a function of level conversion. At the same time, the output buffer is configured to increase the driving capability of the first row-scan signal through the analog buffer amplifier.

Figure 8:
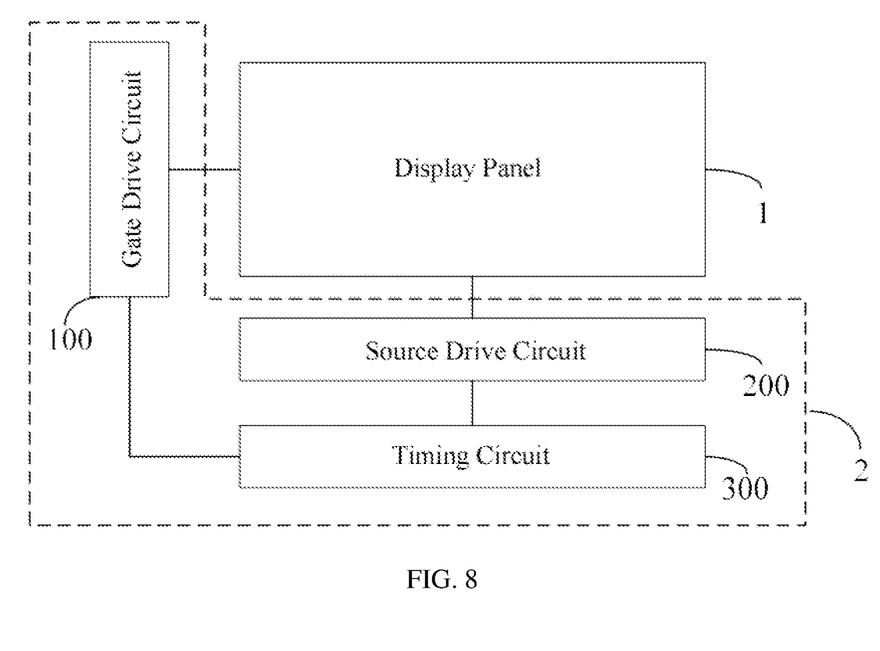
FIG. 8 is a schematic structural diagram of a drive device in accordance with an embodiment of the present application.

As shown in FIG. 8, the present application also provides a drive device 2. The drive device 2 includes a timing controller 300, a source drive circuit 200 and a gate drive circuit 100. For specific structure of the gate drive circuit 100, reference may be made to the above implementation. For example, since the drive device 2 includes all features in any of the above-mentioned embodiments, the drive device 2 thus has at least all the beneficial effects brought by the solutions of the above-mentioned embodiments, which will not be repeated here. The timing controller 300 is respectively connected to the source drive circuit 200 and the gate drive circuit 100. The source drive circuit 200 is connected to a plurality of data lines of the display panel 1. The gate drive circuit 100 is connected to a plurality of gate-lines of the display panel 1.

In this embodiment, the timing controller 300 converts the data signals, control signals and clock signals received from the outside into data signals, control signals and clock signals suitable for the gate drive circuit 100 and the source drive circuit 200 to realize the image display of the display panel 1.

The present application also provides a display device, which includes the display panel 1 and the drive device 2. The specific structure of the drive device 2 may refer to the above-mentioned embodiments. Since the present display device includes all features in any of the above-mentioned embodiments, the display device thus has at least all the beneficial effects brought by the solutions of the above embodiments, which will not be repeated here.

The above embodiments are intended only for illustration to the solutions of the present application rather than limitation. Although the present application is described in detail with reference to the above embodiments, it should be understood for those of ordinary skills in the art that the solutions described in the above embodiments may be modified, or some technical features in the above embodiments may be equivalently replaced, as long as those modifications or replacements do not make the essence of the corresponding solutions deviate from the spirit and scope of the solutions in the embodiments of the present application, then the corresponding solutions should all be included within the protection scope of the present application.

What is claimed is:

1. A gate drive circuit, applied to a display panel, and comprising:
   m switch groups, each switch group comprising n first switch units, wherein an output end of each first switch units is configured in connection with a gate-line of the display panel, controlled ends of the n first switch units in each switch group are connected in common to form a first controlled node, and input ends of i-th first switch units in the m switch groups are connected in common to form an i-th input node, wherein m and n are positive integers, i=1, 2, . . . , n;
   n first shift registers, which are connected in sequence and are respectively connected to the n input nodes in a one-to-one correspondence, wherein the n first shift registers are configured, according to a first start signal and a first clock pulse signal, to output a first row-scan signal to each of the input nodes in turn and loop; and m second shift registers, which are connected in sequence and are respectively connected to m first controlled nodes in a one-to-one correspondence, wherein the m second shift registers are configured, according to a second start signal and a second clock pulse signal, to output a second row-scan signal to each of the first controlled nodes in turn, so as to sequentially trigger on the n first switch units connected to each of the first controlled nodes, so that the first row-scan signal is fed back to each of the gate-lines in turn, wherein the gate drive circuit further comprises a precharge circuit, and the precharge circuit comprises m−1 first unidirectional conduction units and m−1 second unidirectional conduction units;

the m−1 first unidirectional conduction units are respectively connected one by one between adjacent signal output ends of the m second shift registers, and each of the second unidirectional conduction units is respectively connected to the output ends of the second shift registers range from a 2-nd one to a m-th one in a unidirectional manner, a positive input end of each first unidirectional conduction unit is connected to an output end of a previous second shift register or a positive output end of one second unidirectional conduction unit, and a negative output end of each first unidirectional conduction unit is connected to a negative output end of another second unidirectional conduction unit; and each of the first unidirectional conduction units is configured to synchronously output the second row-scan signal output from the previous second shift register to the controlled node where a next second shift register is connected, when the second row-scan signal is output from the previous second shift register, which enables two thin film transistors in n adjacent rows in the display panel to be turned on to perform charging and precharging of data signals.

2. The gate drive circuit according to claim 1, wherein the first switch unit is an electronic switch tube.

3. The gate drive circuit according to claim 1, wherein a duty ratio of the first clock pulse signal and the second clock pulse signal is n:1, and n is greater than 1.

4. The gate drive circuit according to claim 1, wherein the gate drive circuit further comprises n/2 second switch units, the first shift registers are divided into groups, each group has two first shift registers, each of the second switch units is connected in parallel between the output ends of the two first shift registers in each group, controlled ends of the second switch units in each group are connected in parallel to form a second controlled node, and each of the second switch units is configured to be turned on or off simultaneously while receiving a control signal.

5. The gate drive circuit according to claim 1, wherein the second unidirectional conduction unit is configured to isolate the second row-scan signal and prevent the second row-scan signal from feeding back to the second shift registers.

6. The gate drive circuit according to claim 1, wherein the first unidirectional conduction unit and the second unidirectional conduction unit are both diodes.

7. The gate drive circuit according to claim 1, wherein the precharge circuit further comprises m−1 third switch units, each of the third switch units is connected to a front stage of each of the first unidirectional conduction units, and controlled ends of the third switch units are connected in common to form a third controlled node; and each of the third switch units is configured to be turned on or off simultaneously while receiving a control signal.

8. The gate drive circuit according to claim 1, wherein the first shift register and the second shift register are both bidirectional shift registers.

9. The gate drive circuit according to claim 8, wherein the gate drive circuit further comprises first signal input ends for receiving input of a first row-scan-direction control signal, the first signal input ends are respectively connected to signal ends of the n first shift registers; and the n first shift registers are further configured to sequentially output the first row-scan signals in a first direction or sequentially output the first row-scan signals in a second direction according to the first row-scan-direction control signal, and the first direction is opposite to the second direction.

10. The gate drive circuit according to claim 8, wherein the gate drive circuit further comprises second signal input ends for receiving input of a second row-scan-direction control signal, the second signal input ends are respectively connected to signal ends of the m second shift registers; and the m second shift registers are further configured to sequentially output the second row-scan signal in a third direction or sequentially output the second row-scan signal in a fourth direction according to the second row-scan-direction control signal, and the third direction is opposite to the fourth direction.

11. The gate drive circuit according to claim 1, wherein the gate drive circuit further comprises N AND gates and third signal input ends for receiving input of an enable signal, the third signal input ends are respectively connected to first signal input ends of each of the AND gates, and a second signal input end of each of the AND gates is connected to the output end of one of the first switch units, wherein N=m×n; and each of the AND gates is configured to output the first row-scan signal when the enable signal is at a high level, and cut off the first row-scan signal when the enable signal is at a low level.

12. The gate drive circuit according to claim 11, wherein the gate drive circuit further comprises N level converters, each of the level converters is connected to one of the AND gates; and the level converter is configured to convert the first row-scan signal output from the AND gate into a row-output high-level signal or a row-output low-level signal.

13. The gate drive circuit according to claim 12, wherein the gate drive circuit further comprises N output buffers, and the N output buffers are respectively connected to the N level converters in a one-to-one correspondence; and the output buffer is configured to power amplify a level signal output from the level converter.

14. A drive device, comprising:
a timing controller,
a source driver circuit; and
a gate driver circuit, the gate driver circuit comprising:
m switch groups, each switch group comprising n first switch units, wherein an output end of each first switch units is configured in connection with a gate-line of the display panel, controlled ends of the n first switch units in each switch group are connected in common to form a first controlled node, and input ends of i-th first switch units in the m switch groups are connected in common to form an i-th input node, wherein m and n are positive integers, i=1, 2, . . . , n;

n first shift registers, which are connected in sequence and are respectively connected to the n input nodes in a one-to-one correspondence, wherein the n first shift registers are configured, according to a first start signal and a first clock pulse signal, to output a first row-scan signal to each of the input nodes in turn and loop; and m second shift registers, which are connected in sequence and are respectively connected to m first controlled nodes in a one-to-one correspondence, wherein the m second shift registers are configured, according to a second start signal and a second clock pulse signal, to output a second row-scan signal to each of the first controlled nodes in turn, so as to sequentially trigger on the n first switch units connected to each of the first controlled nodes, so that the first row-scan signal is fed back to each of the gate-lines in turn, wherein the gate drive circuit further comprises a precharge circuit, and the precharge circuit comprises m−1 first unidirectional conduction units and m−1 second unidirectional conduction units;

the m−1 first unidirectional conduction units are respectively connected one by one between adjacent signal output ends of the m second shift registers, and each of the second unidirectional conduction units is respectively connected to the output ends of the second shift registers range from a 2-nd one to a m-th one in a unidirectional manner, a positive input end of each first unidirectional conduction unit is connected to an output end of a previous second shift register or a positive output end of one second unidirectional conduction unit, and a negative output end of each first unidirectional conduction unit is connected to a negative output end of another second unidirectional conduction unit; and each of the first unidirectional conduction units is configured to synchronously output the second row-scan signal output from the previous second shift register to the controlled node where a next second shift register is connected, when the second row-scan signal is output from the previous second shift register, which enables two thin film transistors in n adjacent rows in the display panel to be turned on to perform charging and precharging of data signals; and wherein the timing controller is connected to the source drive circuit and the gate drive circuit respectively, the source drive circuit is connected to a plurality of data lines of the display panel, and the gate drive circuit is connected to a plurality of gate-lines of the display panel.

15. A display device, comprising:

a display panel; and a drive device, the drive device comprising:
   a timing controller,
   a source driver circuit; and
   a gate driver circuit, the gate driver circuit comprising:
      m switch groups, each switch group comprising n first switch units, wherein an output end of each first switch units is configured in connection with a gate-line of the display panel, controlled ends of the n first switch units in each switch group are connected in common to form a first controlled node, and input ends of i-th first switch units in the m switch groups are connected in common to form an i-th input node, wherein m and n are positive integers, i=1, 2, . . . , n;

n first shift registers, which are connected in sequence and are respectively connected to the n input nodes in a one-to-one correspondence, wherein the n first shift registers are configured, according to a first start signal and a first clock pulse signal, to output a first row-scan signal to each of the input nodes in turn and loop; and m second shift registers, which are connected in sequence and are respectively connected to m first controlled nodes in a one-to-one correspondence, wherein the m second shift registers are configured, according to a second start signal and a second clock pulse signal, to output a second row-scan signal to each of the first controlled nodes in turn, so as to sequentially trigger on the n first switch units connected to each of the first controlled nodes, so that the first row-scan signal is fed back to each of the gate-lines in turn; and wherein the gate drive circuit further comprises a precharge circuit, and the precharge circuit comprises m−1 first unidirectional conduction units and m−1 second unidirectional conduction units;

the m−1 first unidirectional conduction units are respectively connected one by one between adjacent signal output ends of the m second shift registers, and each of the second unidirectional conduction units is respectively connected to the output ends of the second shift registers range from a 2-nd one to a m-th one in a unidirectional manner, a positive input end of each first unidirectional conduction unit is connected to an output end of a previous second shift register or a positive output end of one second unidirectional conduction unit, and a negative output end of each first unidirectional conduction unit is connected to a negative output end of another second unidirectional conduction unit; and each of the first unidirectional conduction units is configured to synchronously output the second row-scan signal output from the previous second shift register to the controlled node where a next second shift register is connected, when the second row-scan signal is output from the previous second shift register, which enables two thin film transistors in n adjacent rows in the display panel to be turned on to perform charging and precharging of data signals; and wherein the timing controller is connected to the source drive circuit and the gate drive circuit respectively, the source drive circuit is connected to a plurality of data lines of the display panel, and the gate drive circuit is connected to a plurality of gate-lines of the display panel.

* * * * *

UNITED STATES PATENT AND TRADEMARK OFFICE
CERTIFICATE OF CORRECTION

PATENT NO. : 12,315,469 B2
APPLICATION NO. : 17/800341
DATED : May 27, 2025
INVENTOR(S) : Jianlei Li et al.

Page 1 of 1

It is certified that error appears in the above-identified patent and that said Letters Patent is hereby corrected as shown below:

On the Title Page

Under (71) Applicant HKC CORPORATION LIMITED, please change city from Guangdong to "Shenzhen"

Under (73) Assignee HKC CORPORATION LIMITED, please change city from Shenzheng to "Shenzhen"

Signed and Sealed this
Fifteenth Day of July, 2025

Coke Morgan Stewart
*Acting Director of the United States Patent and Trademark Office*